United States Patent [19]
Liao et al.

[11] Patent Number: 6,143,975
[45] Date of Patent: Nov. 7, 2000

[54] THERMOELECTRIC REGENERATOR

[75] Inventors: Reynold L. Liao, Austin; Sean P. O'Neal, Round Rock, both of Tex.

[73] Assignee: Dell USA, L.P., Round Rock, Tex.

[21] Appl. No.: 09/236,782

[22] Filed: Jan. 25, 1999

[51] Int. Cl.[7] .................................................. H01L 35/00
[52] U.S. Cl. ........................... 136/201; 136/205; 136/242
[58] Field of Search ..................................... 136/203, 205, 136/242

[56] References Cited

U.S. PATENT DOCUMENTS

| | | | |
|---|---|---|---|
| 4,812,733 | 3/1989 | Tobey | 323/285 |
| 5,040,381 | 8/1991 | Hazen | 62/3.2 |
| 5,419,780 | 5/1995 | Suski | 136/205 |
| 5,457,342 | 10/1995 | Herbst, II | 257/712 |
| 5,731,954 | 3/1998 | Cheon | 361/699 |

OTHER PUBLICATIONS

F. Liu, *An Intuitive Introduction to Three Effects in Thermoelectricity*, http://schottky.ucsd.edu/~felix/peltier.html, p. 1–4, Mar. 1998.

Ferrotec Corporation © 1997, *Introduction to Thermoelectrical Cooling*, Technical Reference Manual, Part 1,; http://www.ferrotec-america.com/reference 1.html, p. 1–4, Mar. 3, 1998.

*Primary Examiner*—Kathryn Gorgos
*Assistant Examiner*—Thomas H Parsons
*Attorney, Agent, or Firm*—Skjerven, Morrill, MacPherson, LLP; Stephen A. Terrile; Dale R. Cook

[57] ABSTRACT

A system and method which will generate power from waste heat in a data processing system in such a way that system waste heat is reduced within, and no additional power is drawn from, the data processing system. The system includes a thermoelectric regenerator having a hot junction formed between a first material and a second material and a cold junction formed between the first material and the second material; the hot junction located at a hot junction position defined by a hot junction horizontal location and a hot junction vertical location defined relative to a point on a heat source; and the cold junction located at a cold junction position defined by a cold junction horizontal location and a cold junction vertical location defined relative to the point on the heat source such that the difference between the hot junction horizontal location and the cold junction horizontal location yields a non-zero horizontal location difference. The method includes placing a hot junction of a thermoelectric regenerator at a hot junction horizontal position defined relative to a point on a heat source; and placing a cold junction of the thermoelectric generator at a cold junction horizontal position defined relative to a point on a heat source such that the difference between the hot junction horizontal location and the cold junction horizontal location yields a non-zero horizontal location difference.

21 Claims, 8 Drawing Sheets

THERMOELECTRIC REGENERATOR

BACKGROUND OF THE INVENTION

1. Field of the Invention

The present invention relates, in general, to a method and system to be utilized in data processing systems.

2. Description of the Related Art

Data processing systems are systems that manipulate, process, and store data and are notorious within the art. Personal computer systems, and their associated subsystems, constitute well known species of data processing systems.

A personal computer system may be a desktop model system which can include one or more of the following: microprocessors, fans, magnetic disk drives, CD ROM disk drives, keyboards, printer devices, monitors, modems, digital cameras, fax machines, network cards, and various associated data buses to support the foregoing noted devices, as well as the supporting software to allow the foregoing devices to work together to provide a complete standalone system; furthermore, various other devices can also be utilized in order to provide the complete standalone system. Alternatively, a computer system may be a portable laptop or notebook system which can include some or all of the foregoing noted components listed for the desktop model system, and which typically include one or more of the following: batteries, battery chargers, and alternating current (AC) to direct current (DC) power adapters.

Each of the foregoing-referenced data processing system components consumes power and produces waste heat in the process of performing their functions. Furthermore, it will be recognized by those in the art that modem CPUs draw large amounts of power and generate large amounts of waste heat in performing their function.

Both power consumption and waste heat management within data processing systems have become a concern in the data processing art. One reason for this is that electric power must be paid for, so power consumption translates to cost. Another reason is that modem processors are only guaranteed to function appropriately to a particular case temperature. Thus, it is imperative to remove the excess heat from the system, since if the heat is not removed, it can build up and either cause system inaccuracies or actually result in damage to data processing system components. In order to dissipate heat from data processing systems, exhaust fans are often utilized. However, one problem arising from the use of such fans is that they themselves draw power and produce waste heat in the course of performing their functions.

The foregoing discussion regarding thermal and power management concerns applies to virtually all data processing systems. These concerns intensify in the portable data processing (e.g., portable computer) realm.

In portable data processing systems (e.g., notebook, subnotebook, and palmtop computing devices) the system power is typically supplied by batteries. The batteries store a fixed supply of energy, which is depleted by the system over time. Furthermore, portable data processing systems often contain their components in small enclosures, and thus thermal management becomes even more of a problem due to the proximity of the system components. Present portable computing systems also typically utilize exhaust fans in order to dissipate heat. However, in portable systems problems arising from the use of such fans due to the fact that they themselves draw power and produce waste heat in the course of performing their functions becomes even more critical due to the facts that the power is typically supplied by batteries and the system heat is held and produced within a relatively small enclosure.

It is therefore apparent that a need exists in the art for a method and system which will provide for heat dissipation in data processing systems in such a way that neither additional heat i s produced within nor power drawn from the data processing system.

SUMMARY OF THE INVENTION

It has been discovered that a system and method can be produced which will, among other things, generate power from waste heat in a data processing system in such a way that system waste heat is reduced within, and no additional power is drawn from, the data processing system.

The system includes a thermoelectric regenerator having at least one hot junction formed between at least a first material and at least a second material and at least one cold junction formed between the at least a first material and the at least a second material; the at least one hot junction located at a hot junction position defined by a hot junction horizontal location and a hot junction vertical location defined relative to a point on a heat source; and the at least one cold junction located at a cold junction position defined by a cold junction horizontal location and a cold junction vertical location defined relative to the point on the heat source such that the difference between the hot junction horizontal location and the cold junction horizontal location yields a non-zero horizontal location difference. The non-zero horizontal location difference is such that the temperature difference between the at least one hot junction and the at least one cold junction is greater than or equal to the temperature difference between the at least one hot junction and the at least one cold junction in the absence of the non-zero horizontal location difference.

The method includes placing at least one hot junction of a thermoelectric regenerator at a hot junction horizontal position defined relative to a point on a heat source; and placing at least one cold junction of the thermoelectric generator at a cold junction horizontal position defined relative to a point on a heat source such that the difference between the hot junction horizontal location and the cold junction horizontal location yields a non-zero horizontal location difference. Placing the at least one cold junction further includes placing the cold junction such that the non-zero horizontal location difference is such that the temperature difference between the at least one hot junction and at least one cold junction is greater than or equal to the temperature difference between the at least one hot junction and the at least one cold junction in the absence of the non-zero horizontal location difference.

The foregoing is a summary and thus contains, by necessity, simplifications, generalizations and omissions of detail; consequently, those skilled in the art will appreciate that the summary is illustrative only and is not intended to be in any way limiting. Other aspects, inventive features, and advantages of the present invention, as defined solely by the claims, will become apparent in the non-limiting detailed description set forth below.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION OF THE INVENTION

The following sets forth a detailed description of the best contemplated mode for carrying out the multiple independent inventions described herein. The description is intended to be illustrative and should not be taken to be limiting. In addition, the following detailed description has been divided into sections (e.g., sections I–II) in order to highlight the invention described herein; however, those skilled in the art will appreciate that such sections are merely for illustrative focus, and that the invention herein disclosed typically draws its support from multiple sections. Consequently, it is to be understood that the division of the detailed description into separate sections is merely done as an aid to understanding and is in no way intended to be limiting.

I. ENVIRONMENT

Figure 1:
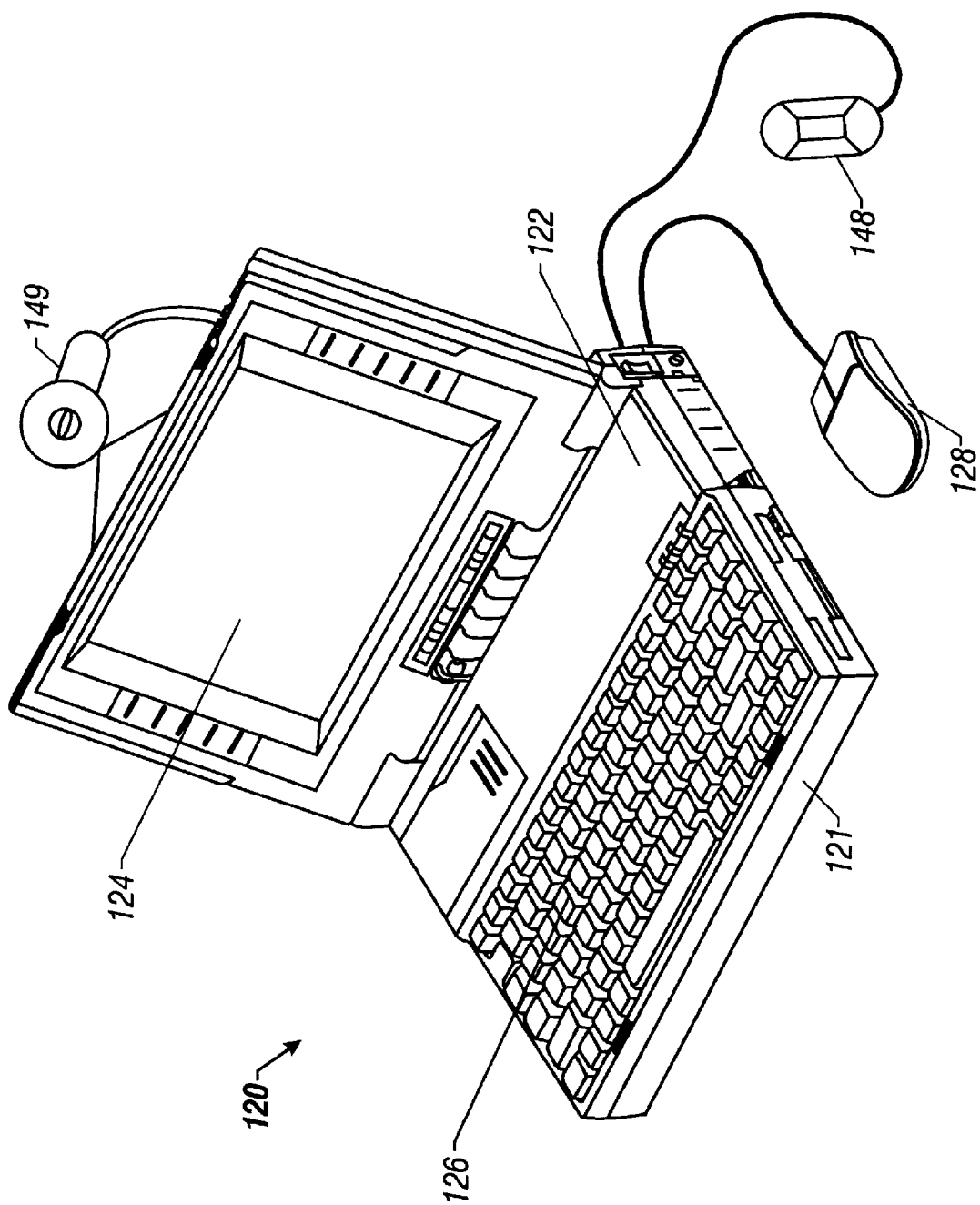
FIG. 1 depicts a pictorial representation of a data-processing system which can be utilized in accordance with the method and system of an illustrative embodiment of the present invention.

With reference now to the figures and in particular with reference now to FIG. 1, there is depicted a pictorial representation of a data-processing system which can be utilized in accordance with the method and system of an illustrative embodiment of the present invention. A portable data processing system 120 is depicted which includes a portable computer data processing case 121, or shell, housing system unit 122, also shown are device video display 124, keyboard 126, mouse 128, microphone 148, and digital camera 149. Portable data processing system 120 may be implemented utilizing any suitable computer such as an IBM-compatible or Apple-compatible workstation, personal computer, notebook computer, or subnotebook computer.

Figure 2:
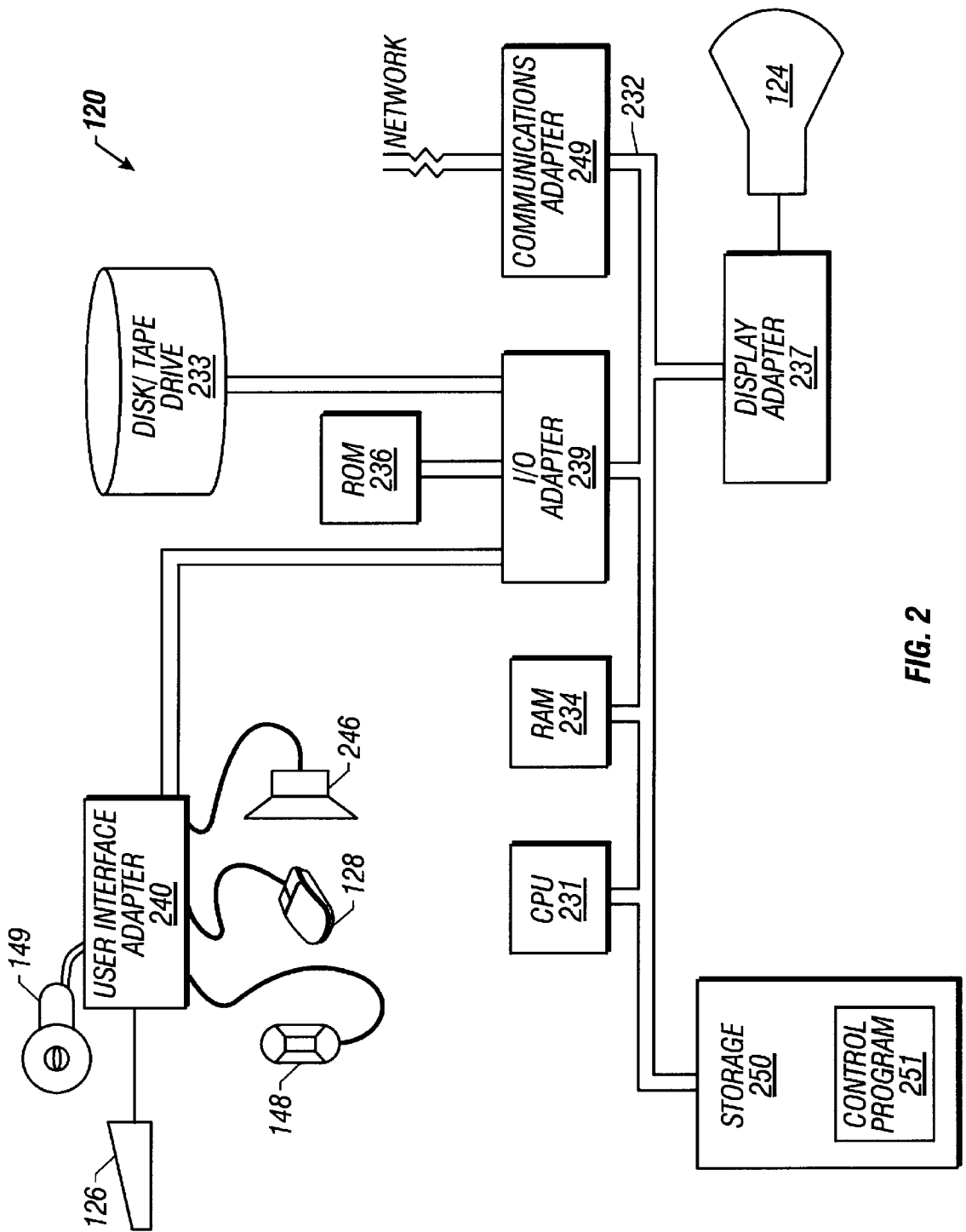
FIG. 2 illustrates a representative hardware environment, which can be utilized in accordance with the method and system of an illustrative embodiment of the present invention.

FIG. 2 is an illustration of a representative hardware environment, which incorporates a graphical user interface, which can be utilized in accordance with the method and system of an illustrative embodiment of the present invention. FIG. 2 depicts selected components in portable data processing system 120 in which an illustrative embodiment of the present invention may be implemented. Data processing system 120 includes a Central Processing Unit ("CPU") 231, such as a conventional microprocessor, and a number of other units interconnected via system bus 232. Such components and units of portable data processing system 120 can be implemented in a system unit such as unit 122 of FIG. 1. Portable data processing system 120 includes random-access memory ("RAM") 234, read-only memory ("ROM") 236, display adapter 237 for connecting system bus 232 to video display device 124, and I/O adapter 239 for connecting peripheral devices (e.g., disk and tape drives 233) to system bus 232. Video display device 124 is the visual output of computer 120, which can be a CRT-based video display well-known in the art of computer hardware. However, with the portable or notebook-based computer shown, video display device 124 is typically an LCD-based or a gas plasma-based flat-panel display. Portable data processing system 120 further includes user interface adapter 240 for connecting keyboard 126, mouse 128, speaker 246, microphone 148, digital camera 149 and/or other user interface devices, such as a touch screen device (not shown), to system bus 232 through I/O adapter 239. Communications adapter 249 connects computer 120 to a data-processing network.

Any suitable machine-readable media may retain the graphical user interface, such as RAM 234, ROM 236, a magnetic diskette, magnetic tape, or optical disk (the last three being located in disk and tape drives 233). Any suitable operating system and associated graphical user interface (e.g., Microsoft Windows) may direct CPU 231. Other technologies can also be utilized in conjunction with CPU 231, such as touch-screen technology or human voice control. In addition, portable data processing system 120 includes a control program 251 which resides within computer storage 250. Control program 251 contains instructions that when executed on CPU 231 carries out the operations depicted in the examples, state diagrams, and flowcharts described herein.

Those skilled in the art will appreciate that the hardware depicted in FIG. 2 may vary for specific applications. For example, other peripheral devices such as optical disk media, audio adapters, or programmable devices, such as PAL or EPROM programming devices well-known in the art of computer hardware, and the like may be utilized in addition to or in place of the hardware already depicted.

It is important that while an illustrative embodiment of the present invention has been, and will continue to be, described in the context of a fully functional computing system, those skilled in the art will appreciate that the mechanisms of the present invention are capable of being distributed as a program product in a variety of forms, and that an illustrative embodiment of the present invention applies equally regardless of the particular type of signal bearing media used to actually carry out the distribution. Examples of a signal bearing media include: recordable type media such as floppy disks, hard disk drives, CD ROMs, and transmission type media such as digital and analogue communication links.

Those skilled in the art will recognize that data processing system 120 can be described in relation to data processing systems which perform essentially the same functionalities, irrespective of architectures. As an example of such, an alternative partial architecture portable data processing system 120 is set forth in FIG. 3.

Figures 3, 3A:
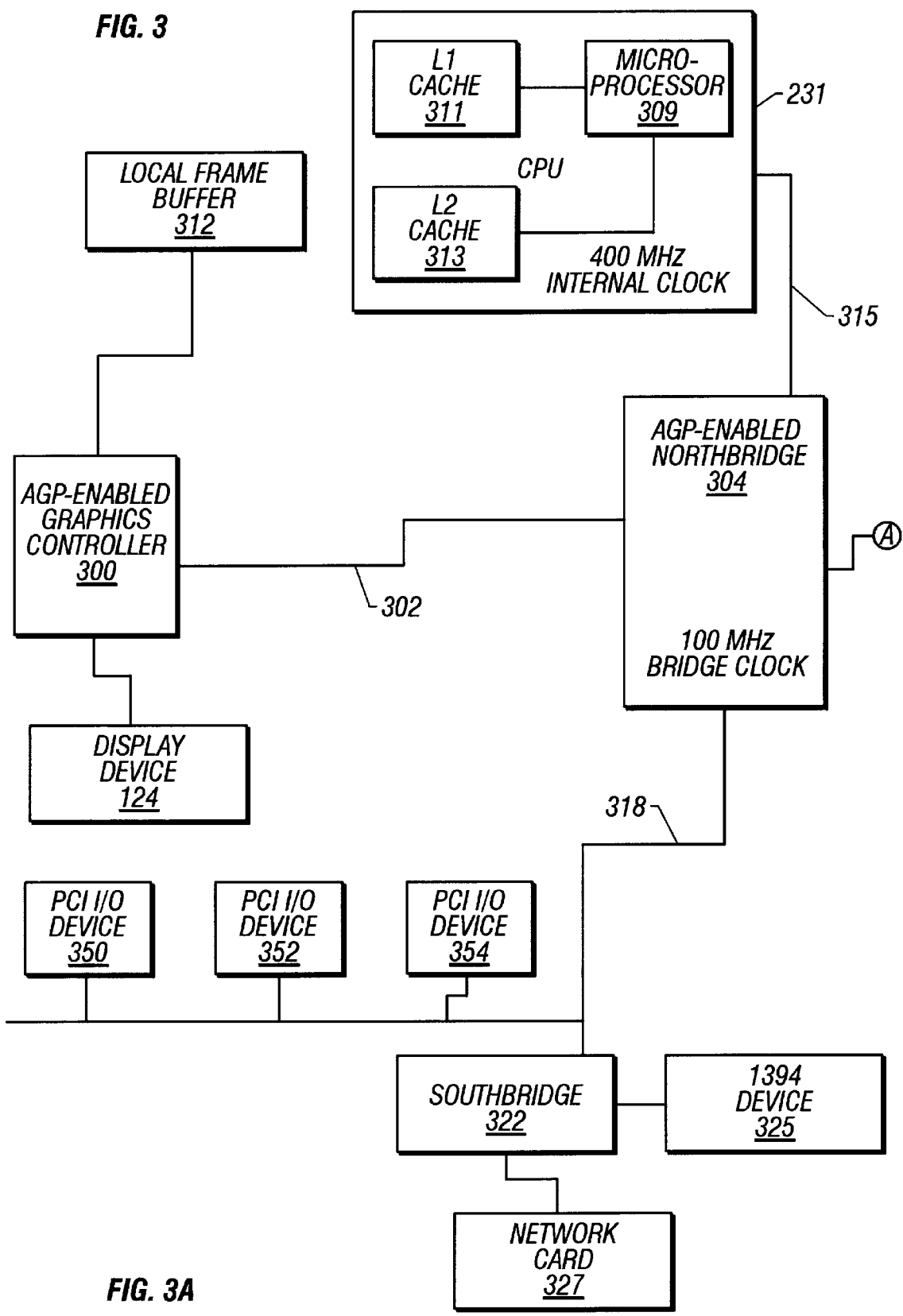
FIG. 3 shows a high-level component diagram depicting a data processing system which forms an environment wherein one or more embodiments of the present invention may be practiced.
Figure 3B:
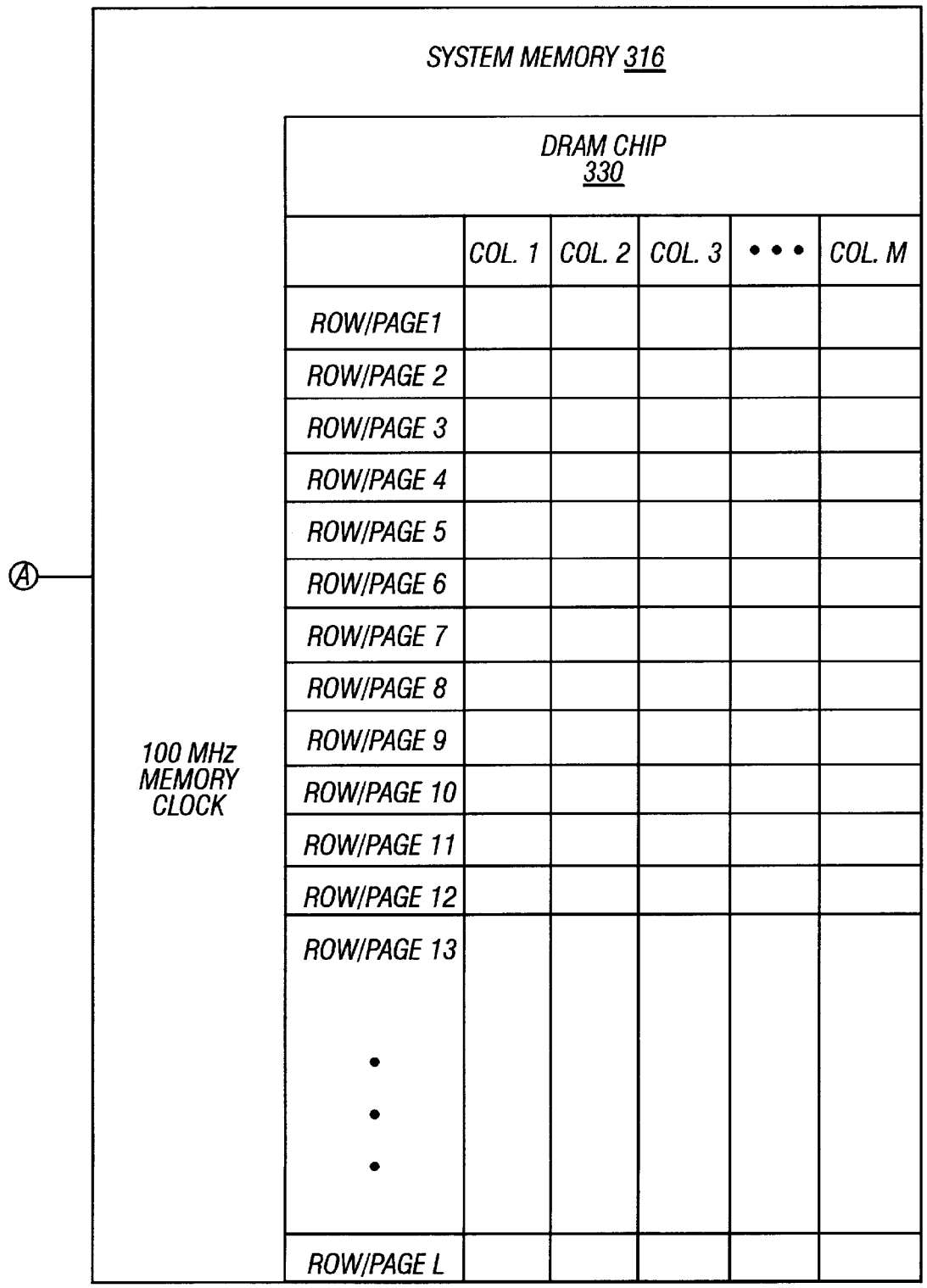

Referring now to FIG. 3, shown is a high-level component diagram depicting a partial data processing system 120 which forms an environment wherein one or more embodiments of the present invention may be practiced. Shown are AGP-enabled graphics controller 300, AGP interconnect 302 (a data bus), and AGP-enabled Northbridge 304. Not shown, but deemed present is an AGP-enabled operating system. The term AGP-enabled is intended to mean that the so-referenced components are engineered such that they interface and function under the standards defined within the AGP interface specification (Intel Corporation, *Accelerated Graphics Port Interface Specification*, Revision 1.0 (Jul. 31, 1996)). Further depicted are video display device 124, local frame buffer 312, Central Processing Unit (CPU) 231 (wherein are depicted microprocessor 309, L1 Cache 311, and L2 Cache 313), CPU bus 315, system memory 316, Peripheral Component Interconnect (PCI) bus 318, various PCI Input-Output (I/O) devices 350, 352, and 354, Southbridge 322, 1394 Device 325, and network card 327.

The foregoing components and devices are used herein as examples for sake of conceptual clarity. As for (non-exclusive) examples, CPU 231 is utilized as an exemplar of any general processing unit, including but not limited to multiprocessor units; CPU bus 315 is utilized as an exemplar of any processing bus, including but not limited to multiprocessor buses; PCI devices 350–352 attached to PCI bus 318 are utilized as an exemplar of any input-output devices attached to any I/O bus; AGP Interconnect 302 is utilized as an exemplar of any graphics bus; AGP-enabled graphics controller 300 is utilized as an exemplar of any graphics controller; Northbridge 304 and Southbridge 322 are utilized as exemplars of any type of bridge; 1394 device 325 is utilized as an exemplar of any type of isochronous source; and network card 327, even though the term "network" is used, is intended to serve as an exemplar of any type of synchronous or asynchronous input-output cards. Consequently, as used herein these specific exemplars are intended to be representative of their more general classes. Furthermore, in general, use of any specific exemplar herein is also intended to be representative of its class and the non-inclusion of such specific devices in the foregoing list should not be taken as indicating that limitation is desired.

Generally, each bus utilizes an independent set of protocols (or rules) to conduct data (e.g., the PCI local bus specification and the AGP interface specification). These protocols are designed into a bus directly and such protocols are commonly referred to as the "architecture" of the bus. In a data transfer between different bus architectures, data being transferred from the first bus architecture may not be in a form that is usable or intelligible by the receiving second bus architecture. Accordingly, communication problems may occur when data must be transferred between different types of buses, such as transferring data from a PCI device on a PCI bus to a CPU on a CPU bus. Thus, a mechanism is developed for "translating" data that are required to be transferred from one bus architecture to another. This translation mechanism is normally contained in a hardware device in the form of a bus-to-bus bridge (or interface) through which the two different types of buses are connected. This is one of the functions of AGP-enabled Northbridge 304, Southbridge 322, and other bridges shown in that it is to be understood that such can translate and coordinate between various data buses and/or devices which communicate through the bridges.

Each component of data processing system 120 draws power and produces waste heat.

II. THERMOELECTRIC REGENERATOR

It has been discovered that a method and system can be produced which will dissipate heat in data processing systems in such a way that neither additional heat is produced within, nor power drawn from, the data processing system. The method and system described herein proves to be particularly useful in portable data processing systems, such as portable data processing system 120.

The method and system described herein utilize a "Seebeck effect" device. The Seebeck effect is described as the "creation" of a current when two different conducting materials are joined in a loop such that the two junctions are maintained at different temperatures. The Seebeck effect is intuitively described in relation to FIG. 4.

Figure 4:
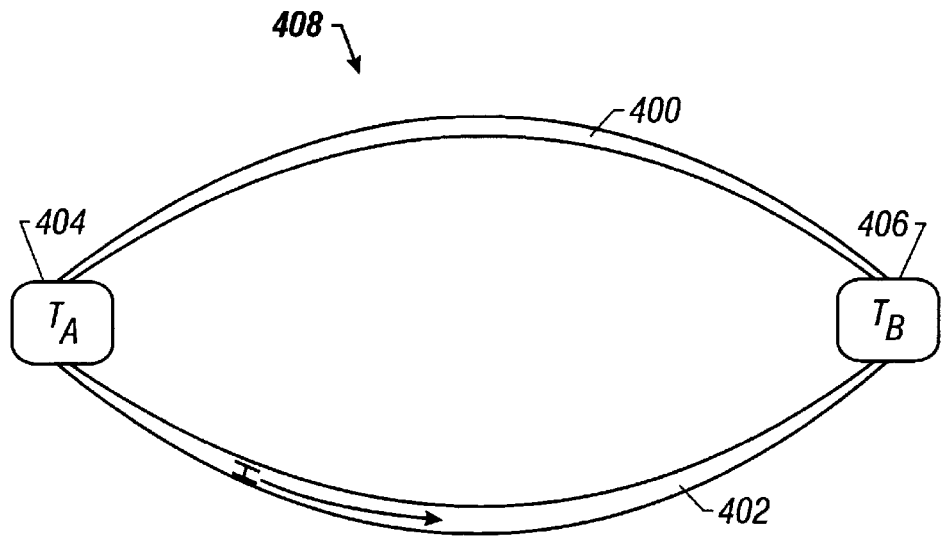
FIG. 4 depicts a pictorial representation of two non-insulating materials.

Referring now to FIG. 4, which shows pictographically two non-insulating materials 400, 402 (conductors or semiconductors) joined in a loop 408, depicted are junction 404 and junction 406. Junction 404 is maintained at a first temperature $T_A$ and junction 406 is maintained at a different second temperature $T_B$. The Seebeck effect is illustrated via current I shown flowing in loop 408 as a result of the temperature differences at junction 404 and junction 406. An intuitive explanation of the Seebeck appears on page 4 of *An Intuitive Introduction to Three Effects in Thermoelectricity* by F. Liu, http://schottky.ucsd.edu/~felix/peltier.html, which is incorporated by reference herein in its entirety.

Figure 5:
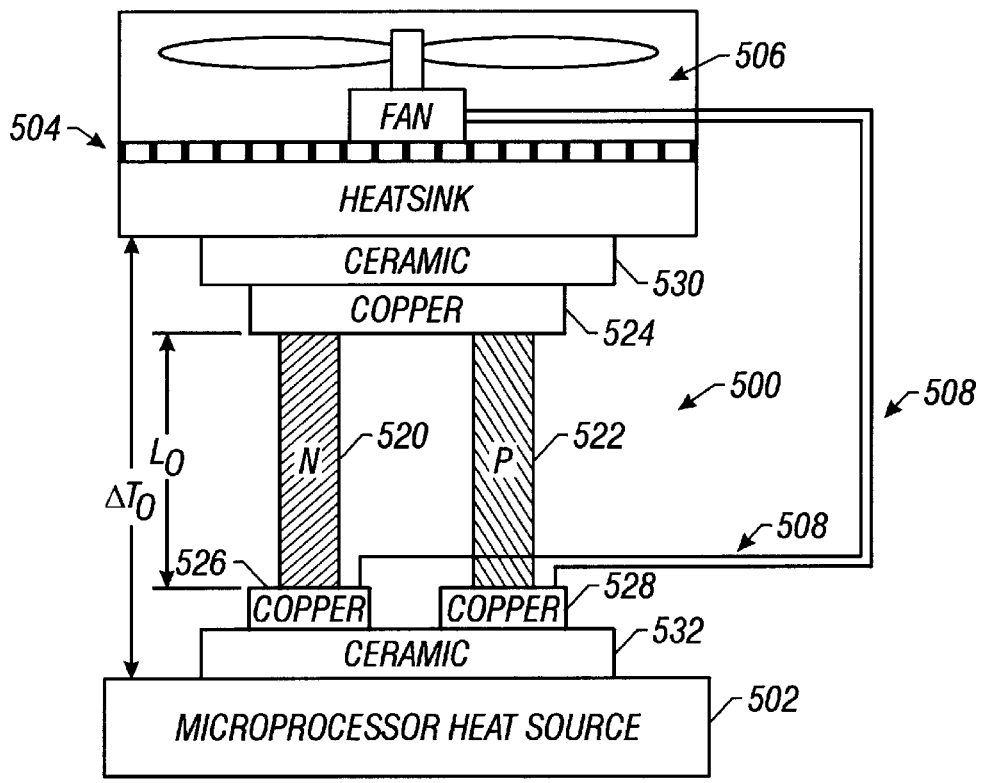
FIG. 5 illustrates a related-art pictographic representation of a microprocessor being cooled by a thermoelectric generator utilizing the Seebeck effect.

It has been found that when current created in one or more loops, such as loop 408, is utilized to do useful work, the junction exposed to the higher temperature will function as a continuous heat sink for heat energy. This fact can be exploited to provide cooling to a data processing system without increasing the power drain on the data processing system or creating excess heat. FIG. 5 depicts an instance of this.

With reference now to FIG. 5, illustrated is a related-art pictographic representation of a microprocessor being cooled by a thermoelectric generator utilizing the Seebeck effect. The pictographic representation of FIG. 5 based upon Suski, U.S. Pat. No. 5,419,780, which is incorporated by reference herein in its entirety, and from which the following description of FIG. 5 is generated.

Schematically illustrated in FIG. 5 is related art thermoelectric generator 500 interposed between microprocessor heat source 502 (which is exemplary, and could in fact be any system component producing heat) and finned heat sink 504. Depicted is that atop finned heatsink 504 sits fan 506. Illustrated is that thermoelectric generator 500 is electrically connected to fan 506 via a pair of wires 508 so that the voltage and current generated by thermoelectric generator 500 is conducted to fan 506.

In operation, when the temperature of microprocessor heat source 502 increases, a temperature differential ΔT develops across the thermoelectric generator 500 between the microprocessor heat source 502 and finned heat sink 504. When the temperature differential ΔT reaches sufficient magnitude, the voltage and current generated by the thermoelectric generator 500 is sufficient to cause fan 506 to operate. The operation of the fan 506 causes airflow across finned heatsink 504 which reduces the temperature of heatsink 504 thus causing more heat to be drawn away from microprocessor heat source 502 to thereby reduce the temperature of microprocessor heat source 502.

With respect to thermoelectric generator 500, basically thermoelectric generator 500 is composed of an N-type semiconductor thermoelement 520 and a P-type semiconductor thermoelement 522. The thermoelements 520, 522 are interconnected at respective first ends by an electrically conducting copper strip 524 and are connected to respective copper strips 526 and 528 at their respective second ends. The copper strips 526 and 528 are connected to the pair of wires 508 to provide the power output of the thermoelectric generator 500. The copper strip 524 is supported by a first plate 530 of highly thermally conductive but electrically insulating material (e.g., ceramic material), and the two copper strips 526 and 528 are supported by a second plate 532 of the same material. The two thermoelements 520, 522 have lengths $L_0$ and a cross-sectional area of $A_0$ (not shown). The related art teaches that power generated by an ideal thermoelectric generator 500 can be expressed as:

$$P_0 = \left(\frac{\alpha^2}{\rho}\right)\left(\frac{\Delta T_0^2}{2}\right)\left[\frac{A_0}{L_0}\right] \quad \text{(Equation 1)}$$

where $P_0$ is the power output of the thermoelectric generator 500, $\alpha$ is the Seebeck coefficient, and $\rho$ is the bulk electrical resistivity of the thermoelements 520, 522. The related art states that although the ratio $A_0/L_0$ implies that the power output $P_0$ increases without bound as the length of the thermoelements 520, 522 approaches 0, the conversion efficiency of the thermoelectric generator 500 decreases with decreasing length. Thus, the related art teaches that as the length of the thermoelements 520, 522 decreases, the power output will reach a maximum at a particular ratio and will then decrease with further decreases in the length of the thermoelements 520, 522.

According to the related art, the power output of the thermoelectric generator 500 can be increased by reducing the length of thermoelectric elements 520, 522. The related art states that although this reduced length decreases the thermoelectric conversion efficiency of thermoelectric generator 500, the reduced efficiency is not a significant fact, and the reduced length has the further advantage of improving the flow of heat from microprocessor heat source 502. The related art further states that the reduced length has the still further advantage of reducing the profile of the thermoelectric generator 500 which is advantageous in the limited space available in a notebook or sub-notebook computer system.

It has been posited that there is a problem related to the related art just described. The problem has to do with the thermal assumptions that were made in the related art. The related art states that the temperature difference across the two junctions of thermoelectric generator 500 would be 80 C–30 C=50 C, if the ambient temperature is 30 C and 80 C is the CPU case temperature.

It has been posited that, in actuality, due to the fact that the regenerator is directly in the path of the cooling solution, the temperature of the two junctions of thermoelectric generator 500 would tend to converge. Thus, it is posited that the $\Delta T_0$ across the regenerator is somewhat decreased from that set forth in the related art. It is estimated that the $\Delta T_0$ would actually only be somewhere in the neighborhood of 5 to 10 C.

This relatively small $\Delta T_0$ arises from the fact that the two junctions of related-art thermoelectric generator 500 are in relatively close proximity to microprocessor heat source 502.

Figure 6:
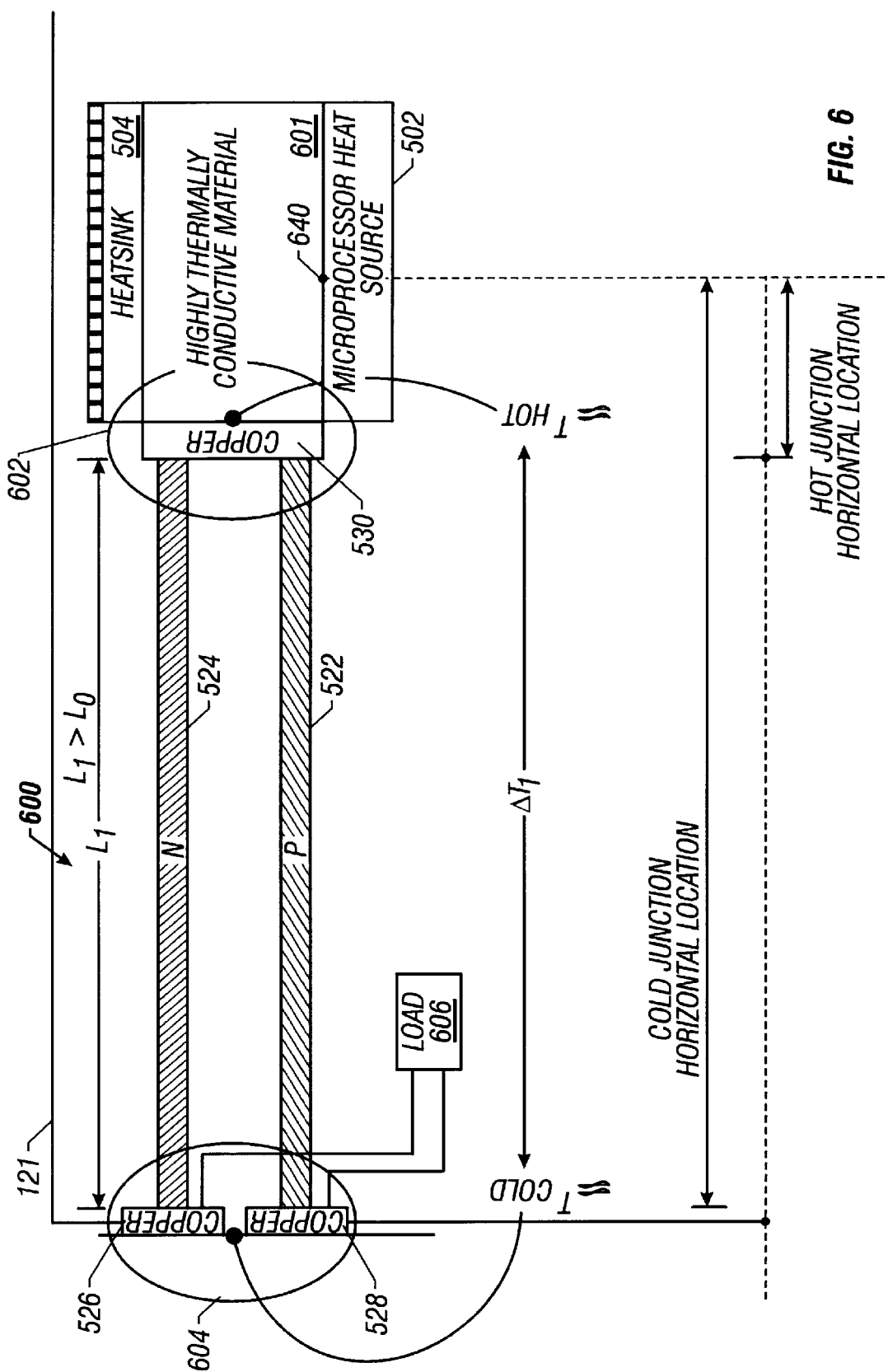
FIG. 6 illustrates an embodiment of the present invention wherein a "hot" junction of a thermoelectric regenerator is located at substantially the same location as the main cooling path of a microprocessor heat source, while a "cold" junction of a thermoelectric generator has been moved a substantial distance away from the main cooling path of the microprocessor heat source.

Referring now to FIG. 6, which illustrates an embodiment of the present invention, shown is thermoelectric regenerator 600 wherein "hot" junction 602 of thermoelectric regenerator 600 is located at substantially the same location as the main cooling path of microprocessor heat source 502, while "cold" junction 604 has been moved a substantial distance away from the main cooling path of microprocessor heat source 502; the location of cold junction 604 distal from hot junction 602 makes it possible to bring junction cold 604 closer to ambient temperature, which is illustrated by the fact that cold junction 604 is shown protruding through case 121 of portable data processing system 120 into ambient air. Like numbered parts of thermoelectric generator 600 function substantially similar to the like number correspondent parts of FIG. 5 except insofar as those parts have been modified to function as described in relation to FIG. 6.

Depicted is that interposed between microprocessor heat source 502 and heatsink 504 is a block of highly thermally conductive material 601 (which may be, for example ceramic). The lock of highly thermally conductive material 601 is such that the temperature is substantially the same as the temperature of the microprocessor heat source 502; that is, block of highly conductive material 601 is constructed to have virtually no heat drop across it so that it is substantially at the temperature of microprocessor heat source 502. Illustrated is that cold junction 604 and hot junction 602 are separated by a horizontal distance (relative to an arbitrarily chosen point 640 on microprocessor heat source 502) of $L_1$, which typically is greater than $L_0$, but less than 10× (ten times) $L_0$, for reasons discussed below. Illustrated is that horizontal distance separation $L_1$ can be referenced relative to the arbitrarily chosen point 640 on microprocessor 502; that is, the horizontal difference is shown to be substantially equivalent as the distance between hot junction horizontal location and cold junction horizontal location, with such locations referenced relative to arbitrarily chosen point 640 on microprocessor heat source 502.

It has been discovered that the illustrated geometry of the two conducting/semi-conducting materials 522, 524 makes it possible to achieve a $\Delta T_1$ substantially greater than that which is possible ($\Delta T_0$) under the teachings of the related art discussed in relation to FIG. 5. With respect to this point, it should be noted that the related art speaks of a temperature differential of 80 C–30 C=50 C will appear across thermoelectric generator 500 before fan 506 turn on. Consequently, these numbers will be used for reference purposes herein, but it is believed that this temperature differential is not credible in light of the teachings of the prior art for the reasons set forth herein, which are mainly that the initial 30 C drop across thermoelectric generator 500 is not likely in the absence of active cooling given the proximity of heat source 502 to heat sink 506. However, irrespective of whether or not the 30 C drop described in the related art is credible, Applicants assert herein that the method and system herein will give a temperature differential substantially greater than that possible using the disclosure of the related art. In addition, those skilled in the art will recognize that the majority of modem microprocessors have maximum specified temperatures of somewhere in the range of 95 C, and thus that the numbers utilized herein are merely illustrative and for comparison purposes.

It was referenced above that the related art states that "the ratio $A_0/L_0$ implies that the power output $P_0$ increases without bound as the length of the thermoelements 520, 522 approaches 0, the conversion efficiency of the thermoelectric generator 500 decreases with decreasing length. Thus, as the length of the thermoelements 520, 522 decreases, the power output will reach a maximum at a particular ratio and will then decrease with further decreases in the length of the thermoelements 520, 522. This indicates that the geometry change illustrated in FIG. 6 would not be desirable or feasible in view of the teachings of the related art. That is, the related art teaches away from the method and system described herein since it teaches attempting to bring the parallel junctions illustrated in FIG. 5 together as closely as possible to get maximum power output.

In contrast to the teaching of the related art, it has been discovered that the resultant gain in $\Delta T$ arising from the geometry illustrated in FIG. 6 and subsequent figures described herein more than makes up for the resultant loss arising from the increased length of thermoelectric elements 522, 524. Recall that the related art equation using the length $L_1$ would indicate:

$$P_1 = \left(\frac{\alpha^2}{\rho}\right)\left(\frac{\Delta T_1^2}{2}\right)\left[\frac{A_0}{L_1}\right] \quad \text{(Equation 2)}$$

From this related art equation it is seen that $P_1$ is directly proportional to the square of $\Delta T_1$, and inversely proportional to length $L_1$. Thus, since $\Delta T_1$, is squared, its effect on the power output is much greater than that of the length. With the geometry change illustrated in FIG. 6, $\Delta T_1$, should be somewhat greater than the temperature differential $\Delta T_0$ that is possible utilizing the teachings of the related art (which the related art claims as being 80–30=50 C, which seems somewhat excessive given the teachings of the related art).

With respect to the embodiment illustrated in FIG. 6 as opposed to that illustrated in FIG. 5, since the difference in these differences is squared, the increase in the power due to temperatures is 50^2/10^2=25× higher. On the other hand, the increase in length in the embodiment illustrated in FIG. 6 could be conservatively held to 10× or so to that illustrated in FIG. 5. Consequently, it is expected that the ideal net improvement in power output would be in the neighborhood of 2.5× (i.e., 25/10=2.5×) that of the embodiment of FIG. 5.

Lastly, it should be noted that fan 506 of FIG. 5 has been replaced by load 606 in FIG. 6. This is done to illustrate that the embodiment of FIG. 6 need not have a fan to function, but rather that the power generated by thermoelectric regenerator 600 can be used to supply power to any device, such as microprocessor heat source 502, another circuit, or even a fan, if such is desired.

It should be noted that the embodiment shown in FIG. 6 has been shown as related to the embodiment of FIG. 5 only for clarity. In point of fact, the purpose of hot junction 602 is to acquire the heat energy of microprocessor heat source 502.

Figure 7:
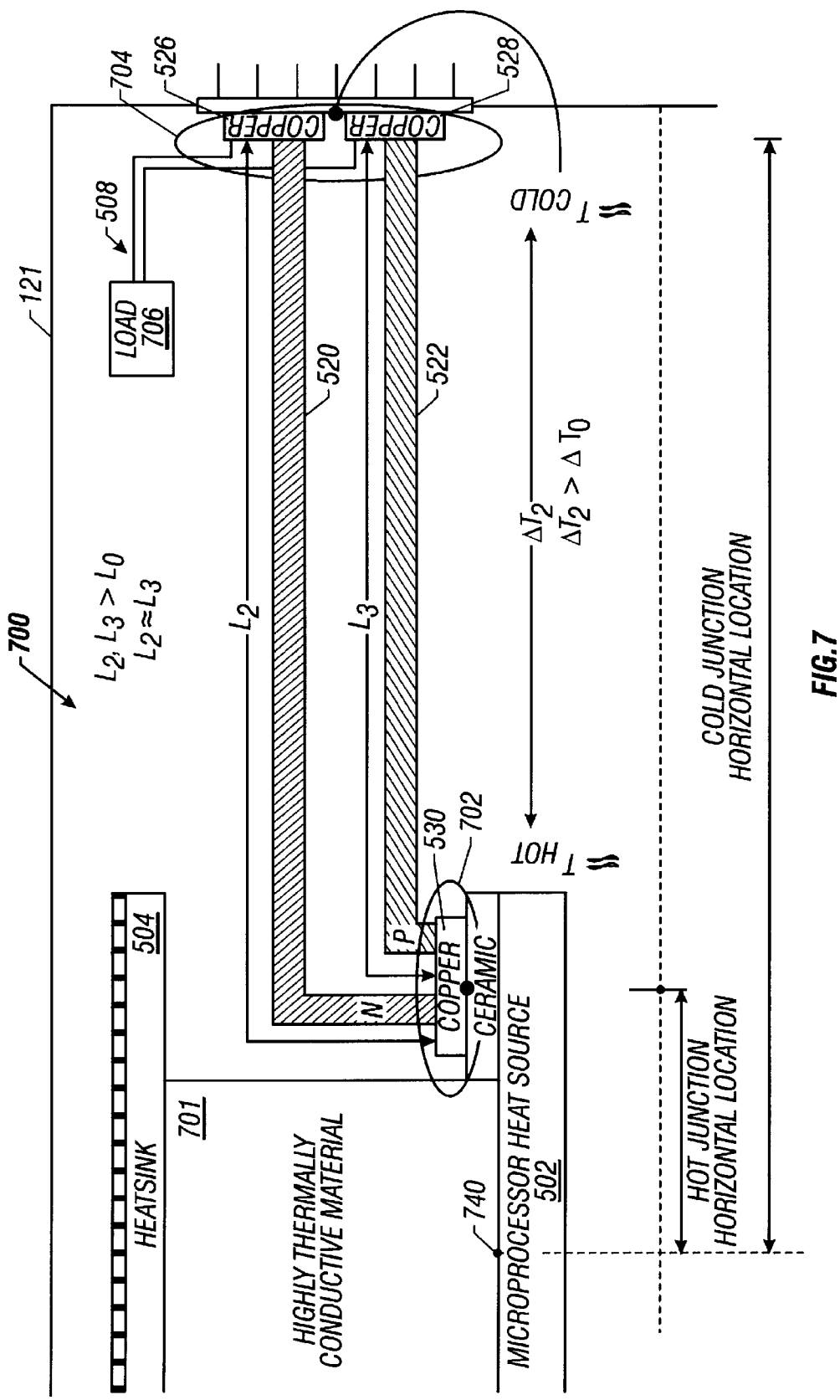
FIG. 7 illustrates an embodiment of the present invention, wherein a "hot" junction of a thermoelectric regenerator is located at substantially the same location as the main cooling path of a microprocessor heat source, while a "cold" junction of the thermoelectric regenerator has been moved a substantial distance away from the main cooling path of microprocessor heat source.

With reference now to FIG. 7, which illustrates an embodiment of the present invention, shown is thermoelectric regenerator 700 wherein "hot" junction 702 of thermoelectric regenerator 700 is located at substantially the same location as the main cooling path of microprocessor heat source 502, while "cold" junction 704 has been moved a substantial distance away from the main cooling path of microprocessor heat source 502; the location of cold junction 704 distal from hot junction 702 makes it possible to bring cold junction 704 closer to ambient temperature. Like numbered parts of thermoelectric generator 700 function substantially similar to the like number correspondent parts of FIG. 6 except insofar as those parts have been modified to function as described in relation to FIG. 7.

Depicted is that interposed between microprocessor heat source 502 and heatsink 504 is a block of highly thermally conductive material 701 (which may be, for example ceramic). Block of highly thermally conductive material 701 is such that the temperature is substantially the same as the temperature of the microprocessor heat source 502; that is, block of highly conductive material 701 is constructed to have virtually no heat drop across it so that it is substantially at the temperature of microprocessor heat source 502. Illustrated is that block of highly thermally conductive material 701 is formed such that hot junction 702 is at substantially the same temperature as microprocessor heat source 502.

Illustrated is that cold junction 704 and hot junction 702 are separated by a horizontal distance (relative to an arbitrarily chosen point 740 on microprocessor heat source 502) of $L_2$ or $L_3$ (as illustrated, $L_2$ and $L_3$ are substantially the same length, since the respective length contribution of the "bends" of thermoelectric materials 520, 522 near hot junction 702 is assumed to be negligible), with the length of $L_2$ or $L_3$ typically greater than $L_0$ but less than 10× (ten times) $L_0$, for reasons discussed below. Illustrated is that horizontal distance separation which is approximately equal to $L_2$ or $L_3$ can be referenced relative to the arbitrarily chosen point 740 on microprocessor 502; that is, the horizontal difference is shown to be substantially equivalent as the distance between hot junction horizontal location and cold junction horizontal location, with such locations referenced relative to arbitrarily chosen point 740 on microprocessor heat source 502.

It has been discovered that the illustrated geometry of the two conducting/semi-conducting materials 520, 522 makes it possible to achieve a $\Delta T_2$ substantially greater than that which is possible ($\Delta T_0$) under the teachings of the related art discussed in relation to FIG. 5. With respect to this point, it should be noted that the related art speaks of a temperature differential of 80 C–30 C=50 C will appear across thermoelectric generator 500 before fan 506 turns on. Consequently, these numbers will be used for reference purposes herein, but it is believed that this temperature differential is not credible in light of the teachings of the prior art for the reasons set forth herein, which are mainly that the initial 30 C drop across thermoelectric generator 500 is not likely in the absence of active cooling given the proximity of heat source 502 to heat sink 506. However, irrespective of whether or not the 30 C drop described in the related art is credible, Applicants assert herein that the method and system herein will give a temperature differential substantially greater than that possible using the disclosure of the related art. In addition, those skilled in the art will recognize that the majority of modern microprocessors have maximum specified temperatures of somewhere in the range of 95 C, and thus that the numbers utilized herein are merely illustrative and for comparison purposes.

It was referenced above that the related art states that "the ratio $A_0/L_0$ implies that the power output $P_0$ increases without bound as the length of the thermoelements 520, 522 approaches 0, the conversion efficiency of the thermoelectric generator 500 decreases with decreasing length. Thus, as the length of the thermoelements 520, 522 decreases, the power output will reach a maximum at a particular ratio and will then decrease with further decreases in the length of the thermoelements 520, 522.". This indicates that the geometry change illustrated in FIG. 7 would not be desirable or feasible in view of the teachings of the related art. That is, the related art teaches away from the method and system described herein since it teaches attempting to bring the parallel junctions illustrated in FIG. 5 together as closely as possible to get maximum power output.

In contrast to the teaching of the related art, it has been discovered that the resultant gain in $\Delta T$ arising from the geometry illustrated in FIG. 7 described herein more than makes up for the resultant loss arising from the increased length of thermoelectric elements 520, 522. Recall that the related art equation using either of the lengths $L_2$ or $L_3$ would indicate (while the embodiment of FIG. 7 is not strictly that of the following equation, it is approximate to the configuration for which the equation is valid):

$$P_2 = \left(\frac{\alpha^2}{\rho}\right)\left(\frac{\Delta T_2^2}{2}\right)\left[\frac{A_0}{L_{2 \text{ or } 3}}\right] \quad \text{(Equation 3)}$$

From this related art equation it is seen that $P_2$ is directly proportional to the square of $\Delta T_2$ and inversely proportional to length $L_2$ or $L_3$. Thus, since $\Delta T_2$ is squared, its effect on the power output is much greater than that of the length. With the geometry change illustrated in FIG. 6, $\Delta T_2$ should be somewhat greater than the temperature differential $\Delta T_0$ that is possible utilizing the teachings of the related art (which the related art claims as being 80−30=50 C, which seems somewhat excessive given the teachings of the related art).

With respect to the embodiment illustrated in FIG. 7 as opposed to that illustrated in FIG. 5, since the difference in these differences is squared, the increase in the power due to temperatures is 50^2/10^2=25× higher. On the other hand, the increase in length in the embodiment illustrated in FIG. 6 could be conservatively held to 10× or so that illustrated in FIG. 5. Consequently, it is expected that the ideal net improvement in power output would be in the neighborhood of 2.5× (i.e., 25/10=2.5×) that of the embodiment of FIG. 5.

Lastly, it should be noted that fan 506 of FIG. 5 has been replaced by load 706 in FIG. 7. This is done to illustrate that the embodiment of FIG. 7 need not have a fan to function, but rather that the power generated by thermoelectric regenerator 700 can be used to supply power to any device, such as microprocessor heat source 502, another circuit, or even a fan, if such is desired.

It should be noted that the embodiment shown in FIG. 7 has been shown as related to the embodiment of FIG. 5 only for clarity. In point of fact, the purpose of hot junction 702 is to acquire the heat energy of microprocessor heat source 502.

Figure 8:
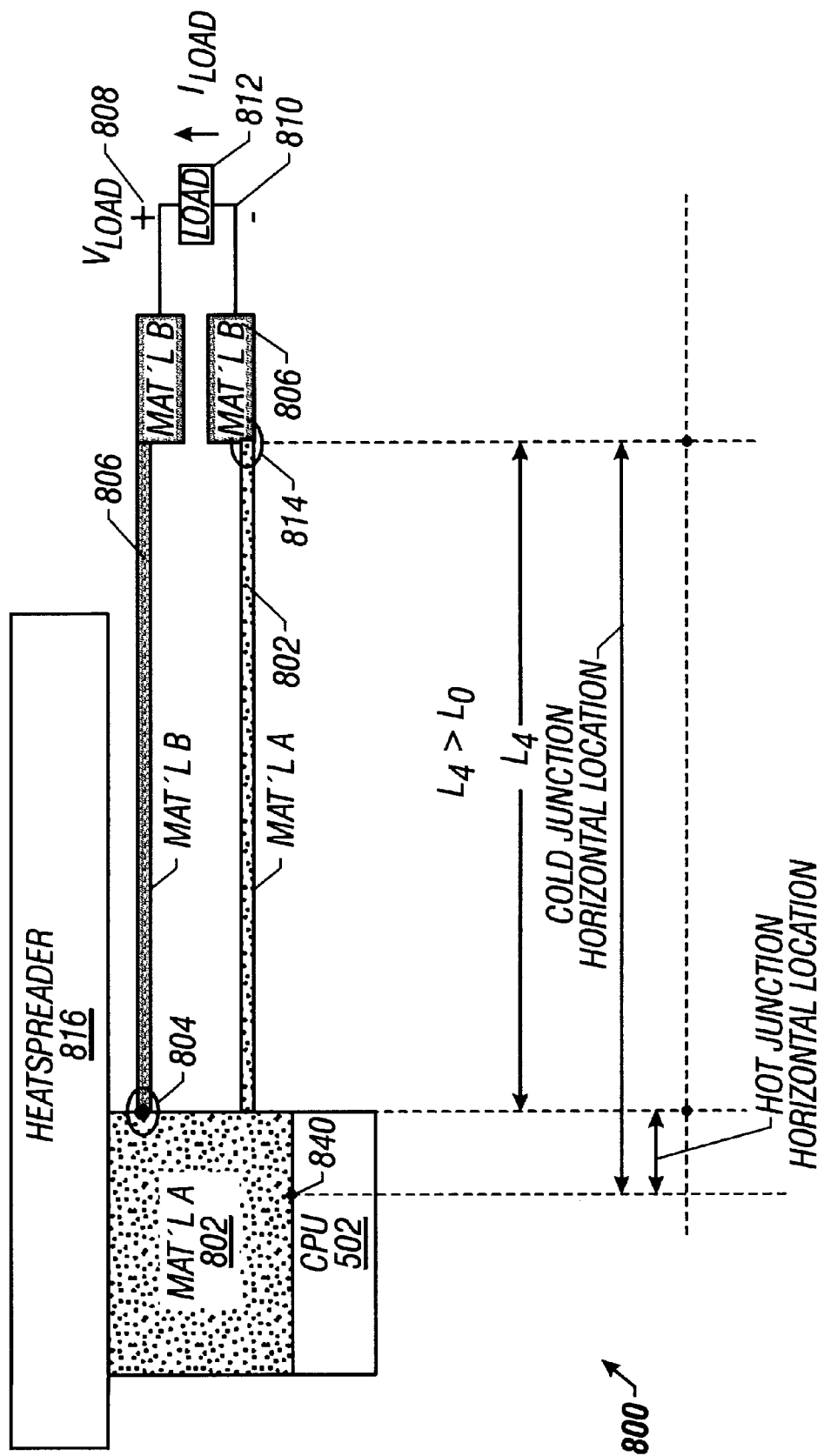
FIG. 8 depicts an embodiment of the present invention wherein a "hot" junction of a thermoelectric regenerator is located at substantially the same location as the main cooling path of a microprocessor heat source, while a "cold" junction of the thermoelectric regenerator has been moved a substantial distance away from the main cooling path of microprocessor heat source.

Referring now to FIG. 8, which depicts an embodiment of the present invention, shown is thermoelectric regenerator 800. Illustrated is that interposed between microprocessor heat source 502 is thermally and electrically conductive material 802 (e.g., PbTe). Shown is that thermally and electrically conductive material 802 is electrically and thermally connected to electrically conductive material 806 (e.g., ZnSb) via hot junction 804. Depicted is that interposed in the path of electrically conductive material 806 is a first terminal 808 and a second terminal 810 of electrical load 812 which extracts $I_{load}$ and $V_{load}$, after which point the path of electrically conductive material 806 resumes.

Electrically conductive material 806 is electrically and thermally connected to electrically and thermally conductive material 802 via cool junction 814, which is distal to hot junction 804. Thereafter, electrically and thermally conductive material 802 extends to and forms a piece with electrically conductive material 802 which is directly proximate to microprocessor heat source 502.

Illustrated is that cold junction 814 and hot junction 804 are separated by a horizontal distance (relative to an arbitrarily chosen point 840 on microprocessor heat source 502) of $L_4$ with the length of $L_4$ typically greater than $L_0$ but less than 10× (ten times) $L_0$, for reasons discussed below. Illustrated is that horizontal distance separation which is approximately equal to $L_4$ can be referenced relative to the arbitrarily chosen point 840 on microprocessor 502; that is, the horizontal difference is shown to be substantially equivalent as the distance between hot junction horizontal location and cold junction horizontal location, with such locations referenced relative to arbitrarily chosen point 840 on microprocessor heat source 502.

It will be understood by those having ordinary skill in the art that electrical load 812 is exemplary of many devices, such as a battery charging circuit, fan, etc.

In summary, the embodiments of FIGS. 6, 7, and 8 represent significant advances over the related art in that they change the related art teachings from thermoelectric generator 500 which is short with parallel sides into a thermoelectric regenerator circuit that is separated into two areas. One area is in the system's current cooling path and the other is moved to a cooler area of a computer (such as a notebook or subnotebook) with exposure to a low temperature region (e.g., ambient air). While there are several advantages associated with the embodiment disclosed, a main benefit is the larger temperature difference that can be achieved while not significantly degrading the other parameters of the device (e.g., increasing the length), which, as demonstrated, translates into significantly increased power output.

The foregoing detailed description has set forth various embodiments of the present invention via the use of block diagrams, pictographic representations, flowcharts and examples. It will be understood as notorious by those within the art that each component, step, and operation illustrated by the use of block diagrams, pictographic representations, and examples can be implemented, individually and/or collectively, by a wide range of hardware, software, firmware, or any combination thereof. However, those skilled in the art will recognize that the embodiments disclosed herein, in whole or in part, can be equivalently implemented in standard Integrated Circuits, as a computer program running on a computer, as firmware, or as virtually any combination thereof and that designing the circuitry and/or writing the code for the software or firmware would be well within the skill of one of ordinary skill in the art in light of this specification.

Other Embodiments

Several various embodiments have been described above, and it will be obvious to those skilled in the art that, based upon the teachings herein, changes and modifications may be made without departing from this invention and its broader aspects. That is, all examples set forth herein are intended to be exemplary and non-limiting.

For example, while the foregoing described embodiments have been described in the context of a single processor for the sake of clarity, it will be understood by those within the art that the present invention could be used in multiple processor environments. Accordingly, the described architectures are not intended to be limiting.

Also, for example, while the embodiments have been described in the exemplary context of the AGP interface standard, it will be recognized that the embodiments herein can be applied to other similar problems which exist in other non-AGP interface standard systems wherein similar problems analogous to those solved by the present invention exist. For example, data processing systems wherein the AGP interface standard is not utilized, such as standard PCI and ISA systems. Thus, the specific protocols described are not intended to be limiting.

Other embodiments are within the following claims.

While particular embodiments of the present invention have been shown and described, it will be obvious to those skilled in the art that, based upon the teachings herein, changes and modifications may be made without departing from this invention and its broader aspects and, therefore, the appended claims are to encompass within their scope all such changes and modifications as are within the true spirit and scope of this invention. Furthermore, it is to be understood that the invention is solely defined by the appended claims. It will be understood by those within the art that if a specific number of an introduced claim element is intended, such an intent will be explicitly recited in the claim, and in the absence of such recitation no such limitation is present. For example, as an aid to understanding, the following appended claims may contain usage of the phrases "at least one" or "one or more," or the indefinite articles "a" or "an," to introduce claim elements. However, the use of such phrases should not be construed to imply that the introduction of a claim element by the indefinite articles "a" or "an" limits any particular claim containing such introduced claim element to inventions containing only one such element, even when the same claim includes the introductory phrases "one or more" or "at least one" and indefinite articles such as "a" or "an", the same holds true for the use of definite articles used to introduce claim elements.

What is claimed is:

1. A system comprising:

a thermoelectric regenerator having at least one hot junction formed between at least a first material and at least a second material and at least one cold junction formed between the at least a first material and the at least a second material;

the at least one hot junction located at a hot junction position defined by a hot junction horizontal location and a hot junction vertical location defined relative to a coordinate system having a vertical axis originating at a point on a surface of a heat source, the vertical axis pointing toward a heat sink and a horizontal axis normal to the vertical axis and intersecting the point; and the at least one cold junction located at a cold junction position defined by a cold junction horizontal location and a cold junction vertical location defined relative to the coordinate system such that the difference between the hot junction horizontal location and the cold junction horizontal location yields a non-zero horizontal location difference and such that the cold junction horizontal position is such that the cold junction does not intersect the heat source.

2. The system of claim 1, wherein the non-zero horizontal location difference further includes:

the non-zero horizontal location difference such that the temperature difference between the at least one hot junction and the at least one cold junction is greater than or equal to the temperature difference between the at least one hot junction and the at least one cold junction in the absence of the non-zero horizontal location difference.

3. The system of claim 1, further comprising:

the first material having at least a first material length; and the second material having at least a second material length; and the first material and second material formed such that they substantially parallel each other.

4. The system of claim 3, wherein the at least one cold junction located at a cold junction position defined by a cold junction horizontal location and a cold junction vertical location relative to the coordinate system such that the difference between the hot junction horizontal location and the cold junction horizontal location yields a non-zero horizontal location difference further includes:

the non-zero horizontal location difference such that a first effect on a power output arising from a temperature difference between the at least one hot junction and the at least one cold junction is greater than or equal to a second effect on the power output arising from an increase in the first material length and the second material length in the absence of the non-zero horizontal location difference.

5. The system of claim 1, wherein the at least one cold junction located at a cold junction position defined by a cold junction horizontal location and a cold junction vertical location relative to the coordinate system such that the difference between the hot junction horizontal location and the cold junction horizontal location yields a non-zero horizontal location difference further includes:

a highly thermally conductive material proximate to the heat source;

the hot junction proximate to said conducting material; and the cold junction proximate to a region of a substantially lower temperature than a heat source temperature.

6. The system of claim 5, wherein the highly thermally conductive material proximate to the heat source further includes:

a highly thermally conductive material interposed between the heat source and a heatsink.

7. The system of claim 5, wherein the highly thermally conductive material proximate to the heat source further includes:

a highly thermally conductive material adjacent to the heat source and a heatsink.

8. The system of claim 5, wherein the cold junction proximate to a region of a substantially lower temperature than a heat source temperature further includes:

the cold junction substantially adjacent to a computer case.

9. The system of claim 8, wherein the cold junction substantially adjacent to a computer case further includes:

the cold junction substantially adjacent to a notebook computer case.

10. The system of claim 1, wherein the first material further includes a conducting material.

11. The system of claim 1, wherein the first material further includes a semi-conducting material.

12. The system of claim 1, wherein the second material further includes a conducting material.

13. The system of claim 1, wherein the second material further includes a semi-conducting material.

14. The system of claim 1, wherein said system further comprises:

an operating system;

a processing unit;

a first bridge;

a system memory; and an input-output bus.

15. The system of claim 1, further comprising:

a graphics bus;

a graphics controller;

a local frame buffer;

a display device;

an input-output bridge; and a network card.

16. The system of claim 15, further comprising:

a hard drive;

a digital camera;

a microphone; and videoconferencing software.

17. A method comprising:

placing at least one hot junction of a thermoelectric regenerator at a hot junction horizontal position defined relative to a coordinate system having a vertical axis originating on a point on a surface of a heat source, the vertical axis pointing toward a heat sink and a horizontal axis normal to the vertical axis and intersecting the point; and placing at least one cold junction of the thermoelectric generator at a cold junction horizontal position defined relative to the coordinate system such that the difference between the hot junction horizontal location and the cold junction horizontal location yields a non-zero horizontal location difference and such that the cold junction horizontal position is such that the cold junction does not intersect the heat source.

18. The method of claim 17, wherein said placing at least one cold junction of the thermoelectric generator at a cold junction horizontal position defined relative to the coordinate system such that the difference between the hot junction horizontal location and the cold junction horizontal location yields a non-zero horizontal location difference further includes:

placing the cold junction such that the non-zero horizontal location difference is such that the temperature difference between the at least one hot junction and at least one cold junction is greater than or equal to the temperature difference between the at least one hot junction and the at least one cold junction in the absence of the non-zero, horizontal location difference.

19. The method of claim 17, wherein said placing at least one cold junction of the thermoelectric generator at a cold junction horizontal position defined relative to the coordinate system such that the difference between the hot junction horizontal location and the cold junction horizontal location yields a non-zero horizontal location difference further includes:

placing the cold junction substantially adjacent to a computer case.

20. The method of claim 17, wherein said placing at least one cold junction of the thermoelectric generator at a cold junction horizontal position defined relative to the coordinate system such that the difference between the hot junction horizontal location and the cold junction horizontal location yields a non-zero horizontal location difference further includes:

placing the hot junction substantially adjacent to the heat source.

21. A computer system comprising:

a thermoelectric regenerator having at least one hot junction formed between at least a first material and at least a second material and at least one cold junction formed between the at least a first material and the at least a second material;

the at least one hot junction located at a hot junction position defined by a hot junction horizontal location and a hot junction vertical location defined relative to a coordinate system having a vertical axis originating on a point on a surface of a heat source, the vertical axis pointing toward a heat sink and a horizontal axis normal to the vertical axis and intersecting the point;

the at least one cold junction located at a cold junction position defined by a cold junction horizontal location and a cold junction vertical location relative to the coordinate system such that the difference between the hot junction horizontal location and the cold junction horizontal location yields a non-zero horizontal location difference and such that the cold junction horizontal position is such that the cold junction does not intersect the heat source;

an operating system;

a processing unit;

a system memory;

an input-output bus; and a hard drive.

* * * * *